US009052351B2

(12) United States Patent
Reed et al.

(10) Patent No.: US 9,052,351 B2
(45) Date of Patent: Jun. 9, 2015

(54) METHOD AND APPARATUS FOR PREVENTING ELECTRICITY METER FAILURE

(71) Applicant: Sensus USA Inc., Raleigh, NC (US)

(72) Inventors: Marc L. Reed, Mandeville, LA (US);
Jared Rude, Raleigh, NC (US); Andrew Dudding, Cary, NC (US); Michael Brown, Mandeville, LA (US); William R. Mazza, Jr., Harrison City, PA (US)

(73) Assignee: SENSUS USA INC., Raleigh, NC (US)

( * ) Notice: Subject to any disclaimer, the term of this patent is extended or adjusted under 35 U.S.C. 154(b) by 193 days.

(21) Appl. No.: 13/622,857

(22) Filed: Sep. 19, 2012

(65) Prior Publication Data

US 2014/0077821 A1 Mar. 20, 2014

(51) Int. Cl.
*G01R 31/04* (2006.01)
*G01R 35/04* (2006.01)
*G01R 31/00* (2006.01)

(52) U.S. Cl.
CPC ............... *G01R 31/04* (2013.01); *G01R 35/04* (2013.01); *G01R 31/003* (2013.01)

(58) Field of Classification Search
CPC .......................................... G01R 31/04–31/048
USPC .................................. 324/538–544; 714/47.3
See application file for complete search history.

(56) References Cited

U.S. PATENT DOCUMENTS

| 5,333,676 | A | * | 8/1994 | Mizuno | ............. | 165/294 |
| 7,068,184 | B2 | | 6/2006 | Yee et al. | | |
| 2005/0104575 | A1 | | 5/2005 | Yee et al. | | |
| 2008/0084216 | A1 | | 4/2008 | Sanderford et al. | | |
| 2008/0262820 | A1 | * | 10/2008 | Nasle | ............. | 703/18 |
| 2009/0207034 | A1 | * | 8/2009 | Tinaphong et al. | ............. | 340/635 |
| 2009/0234980 | A1 | * | 9/2009 | Barrenscheen et al. | ............. | 710/18 |

(Continued)

FOREIGN PATENT DOCUMENTS

| CN | 201087842 Y | * | 7/2008 |
| CN | 202093069 U | * | 12/2011 |
| WO | WO 00/33091 A1 | | 6/2000 |

OTHER PUBLICATIONS

International Search Report and Written Opinion issued Mar. 19, 2013, in PCT/US2013/021710 filed Jan. 16, 2013.

(Continued)

*Primary Examiner* — Patrick Assouad
*Assistant Examiner* — Demetrius Pretlow
(74) *Attorney, Agent, or Firm* — Oblon, McClelland, Maier & Neustadt, L.L.P.

(57) ABSTRACT

A method and apparatus that monitors and controls an operation of an electricity meter. A potential failure condition of an electrical connection between an electricity meter and a meter socket in an electrical line that provides power from a power supply to an electrical load through the electricity meter, is detected. A correction time may be determined based on a temperature in a vicinity of and a current through the electrical connection, and may indicate an amount of time before a predicted failure of the electrical connection will occur. The method determines whether the electricity meter is in an imminent failure condition based on the correction time or the information used to detect the potential failure condition of the electrical connection. The method may provide either, or both, notification of the imminent failure condition and disconnection of power to the electrical load by operating a disconnection switch.

24 Claims, 11 Drawing Sheets

(56) References Cited

U.S. PATENT DOCUMENTS

| | | |
|---|---|---|
| 2010/0036624 A1 | 2/2010 | Martin et al. |
| 2010/0037639 A1* | 2/2010 | Ogden et al. .................... 62/127 |
| 2010/0318233 A1* | 12/2010 | Yunes et al. .................. 700/287 |
| 2011/0095625 A1 | 4/2011 | Voisine |
| 2012/0299745 A1* | 11/2012 | LaFrance et al. ........ 340/870.02 |

OTHER PUBLICATIONS

Steve Daniels, "ComEd smart meters associated with three fires in suburban Chicago homes", Aug. 30, 2012, pp. 1-2, Crain's Chicago Business.

* cited by examiner

| Time | Temperature | | | | | | | | | | | |
|---|---|---|---|---|---|---|---|---|---|---|---|---|
| Current | Temp 1 | Temp 2 | Temp 3 | Temp 4 | Temp 5 | Temp 6 | Temp 7 | Temp 8 | Temp 9 | Temp 10 | Temp 11 | Temp 12 |
| Current 1 | 1000 | 1000 | 1000 | 1000 | 900 | 800 | 600 | 600 | 500 | 200 | 200 | 0 |
| Current 2 | 1000 | 1000 | 1000 | 900 | 800 | 600 | 600 | 500 | 500 | 100 | 100 | 0 |
| Current 3 | 1000 | 900 | 900 | 800 | 600 | 500 | 500 | 500 | 400 | 100 | 50 | 0 |
| Current 4 | 900 | 900 | 800 | 600 | 500 | 500 | 400 | 400 | 400 | 50 | 0 | 0 |
| Current 5 | 800 | 800 | 600 | 500 | 500 | 400 | 200 | 200 | 200 | 0 | 0 | 0 |
| Current 6 | 600 | 600 | 500 | 500 | 400 | 200 | 200 | 200 | 100 | 0 | 0 | 0 |
| Current 7 | 500 | 500 | 400 | 400 | 200 | 200 | 200 | 100 | 50 | 0 | 0 | 0 |
| Current 8 | 400 | 400 | 400 | 200 | 200 | 200 | 100 | 50 | 0 | 0 | 0 | 0 |
| Current 9 | 300 | 200 | 200 | 200 | 100 | 100 | 50 | 0 | 0 | 0 | 0 | 0 |
| Current 10 | 200 | 200 | 200 | 100 | 50 | 50 | 0 | 0 | 0 | 0 | 0 | 0 |
| Current 11 | 100 | 100 | 100 | 50 | 0 | 0 | 0 | 0 | 0 | 0 | 0 | 0 |
| Current 12 | 100 | 100 | 100 | 0 | 0 | 0 | 0 | 0 | 0 | 0 | 0 | 0 |
| Current 13 | 100 | 50 | 50 | 0 | 0 | 0 | 0 | 0 | 0 | 0 | 0 | 0 |
| Current 14 | 50 | 0 | 0 | 0 | 0 | 0 | 0 | 0 | 0 | 0 | 0 | 0 |
| Current 15 | 0 | 0 | 0 | 0 | 0 | 0 | 0 | 0 | 0 | 0 | 0 | 0 |
| Current 16 | 0 | 0 | 0 | 0 | 0 | 0 | 0 | 0 | 0 | 0 | 0 | 0 |

METHOD AND APPARATUS FOR PREVENTING ELECTRICITY METER FAILURE

FIELD

The present invention relates to a method and apparatus that prevents a failure of an electricity meter due at least to a deterioration of an electrical connection of the electricity meter socket between a power source and a load.

BACKGROUND

Conventional electricity meters include an electrical connection between a power source and a load. Deterioration of an electrical connection, including, for example, deterioration of the electricity meter socket, can create a high temperature heat source within an electricity meter. While alerts may be sent to a utility, conventional meters continue to operate in this condition in which the electricity meter is subject to excessive heat. Continued operation in this condition can cause an electricity meter to fail.

SUMMARY

Accordingly, one object of the method and apparatus described herein, is to monitor and control the operation of an electricity meter and preventively disconnect a power supply to a load before a failure causing damage to the electricity meter occurs.

Another object of the method and apparatus is to determine an amount of time before a predicted failure of an electrical connection will occur based on a detected potential failure condition. A further object of the method and apparatus is to transmit the amount of time to a utility in order to perform appropriate maintenance to the electricity meter.

BRIEF DESCRIPTION OF THE DRAWINGS

A more complete appreciation of aspects of this disclosure and many of the attendant advantages thereof will be readily obtained by reference to the following detailed description when considered in connection with the accompanying drawings, wherein:

FIG. 4 shows a lookup table, an example of an algorithm which may be used to determine a correction time;

DETAILED DESCRIPTION

According to one aspect of the present invention, there is provided a system including a meter (electricity meter or other power measurement device), and a method for monitoring and controlling the operation of the meter to prevent a failure of and/or damage to the meter. The method is applied to the electrical connection of a meter in an electrical line that provides power from a power source to a load through the meter. The method includes detecting at least one potential failure condition of the electrical connection, and determining a correction time based on the detected at least one potential failure condition. The correction time estimates the amount of time before a predicted failure of the electrical connection will occur. The method includes determining whether the meter is in an imminent failure condition based on one of the correction time and the detected at least one potential failure condition of the electrical connection. The method further includes disconnecting power to the load through a switch within the meter, when it is determined the meter is in the imminent failure condition.

According to another aspect of the present invention, there is provided a system including a meter (electricity meter or other power measurement device), and an apparatus for monitoring and controlling the operation of the meter to prevent a failure of and/or damage to the meter. The apparatus monitors the condition of an electrical connection that provides power to a load from a power source through the meter. The electrical connection is provided through contacts of the meter, which may be received in a meter socket to connect the power source to the load. The apparatus includes a detection unit that detects at least one potential failure condition of the electrical connection. The apparatus further includes a controller that determines a correction time based on the detected at least one potential failure condition of the electrical connection. The controller determines whether the meter is in an imminent failure condition based on the correction time or the detected at least one failure condition of the electrical connection. The controller disconnects power to the load through a switch within the meter, when it is determined the meter is in the imminent failure condition.

Figure 1:
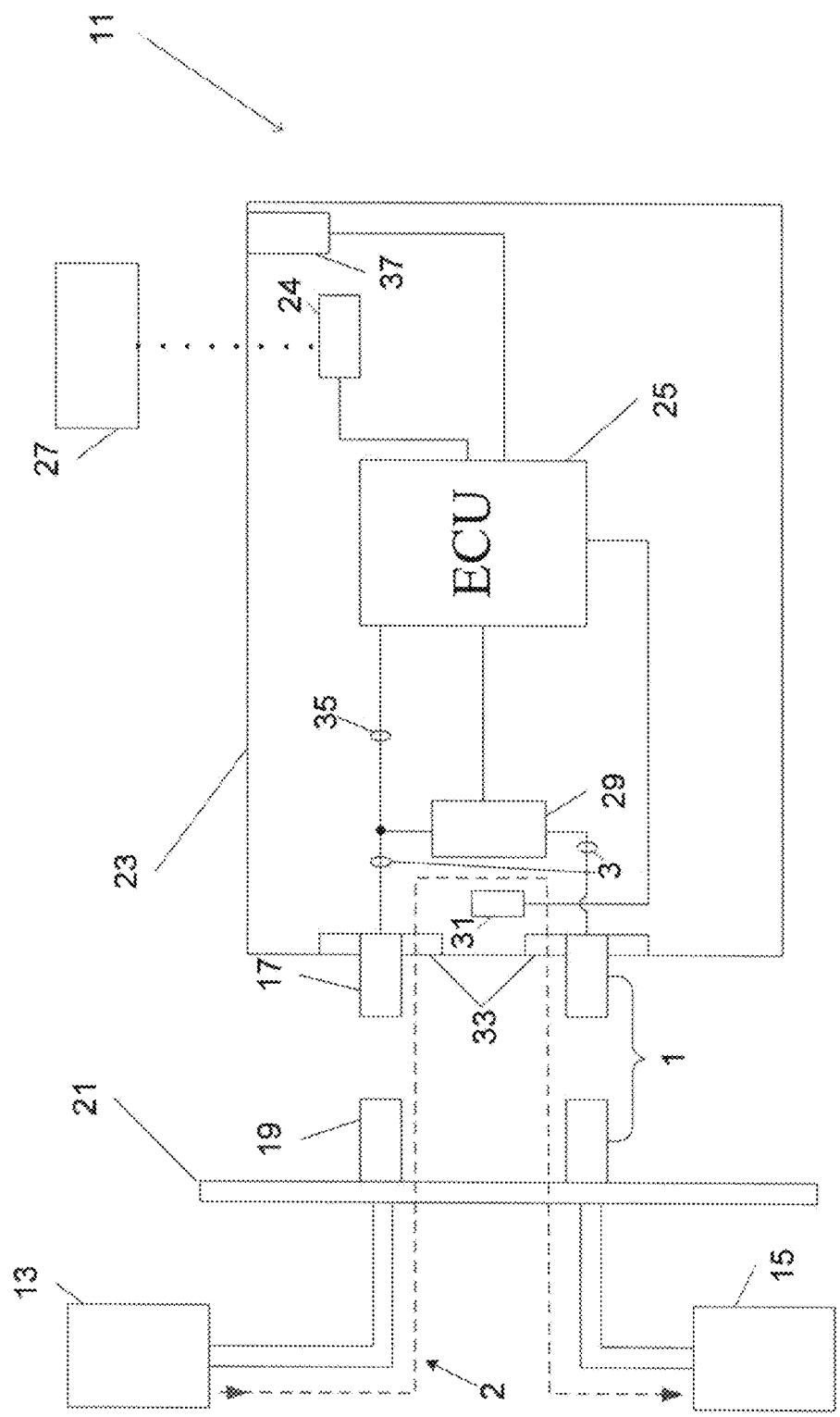
FIG. 1 is a block diagram for a system including an apparatus for monitoring and controlling the operation of a meter that connects a power source to a load.

Referring now to the drawings, wherein like reference numerals designate identical or corresponding parts throughout the several views. FIG. 1 is a block diagram of an electrical connection 1 in a line 2 that connects a power supply 13 to an electrical load 15. The electrical connection 1 is provided in the line 2 by the contact between contacts 17 of the electricity meter 11 and contacts 19 of a power panel 21. The contacts 19 of the power panel provide a meter socket that receives the contacts 17 of the electricity meter 11. An enclosure 23 of the electricity meter 11 houses a controller 25, and a communications board 24 that transmits information from the controller 25 to a back end 27. The back end 27 being part of a network (not shown) that communicates with multiple electricity meters 11.

A disconnect switch 29 is provided in an internal line 3 within the electricity meter 11. The disconnect switch 29 can be operated by the controller 25 to disconnect the power supply 13 from the electrical load 15. The electricity meter 11 is also provided with at least one temperature sensor 31 for detecting a temperature in the vicinity of the electrical connection 1, and at least one current sensor 33 for detecting a current through the electrical connection 1. In addition, the electricity meter 11 is provided with an auxiliary power connection 35, such that when the disconnect switch 29 is opened and the power supply 13 is disconnected from the electrical load 15, the electricity meter 11, and thus the controller 25, is still provided with power. The disconnect switch 29 can be operated remotely.

The controller 25 can send and receive information from the back end 27, including updated values for threshold values and look up tables used in the exemplary processes and discussed in more detail herein. The threshold values may be updated dynamically in response to the detection of certain operational parameters, or conditions which may be determined by a utility or other user. Similarly, look up tables used to determine correction time or a reference rate of change in temperature, can be updated dynamically in response to the detection of operating parameter of the electricity meter 11, or external conditions that may dictate different response times or permissible rates at which temperature can change. The updates can be provided through a network communication or through onsite maintenance of the electricity meter 11.

Figure 2:
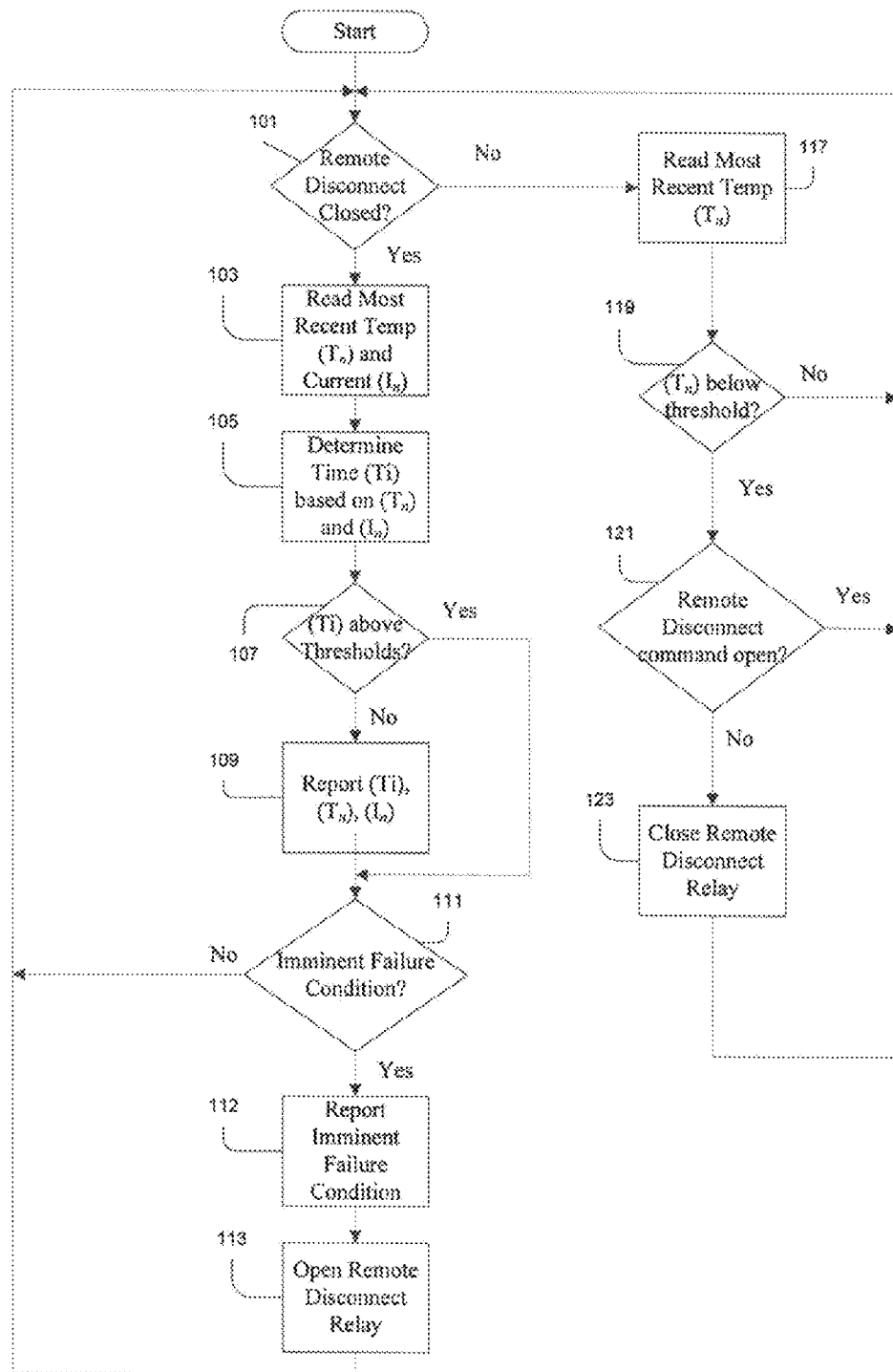
FIG. 2 is a flow chart illustrating an exemplary process for detecting a potential failure condition of an electrical connection and determining whether a meter is in an imminent failure condition.

FIG. 2 is a flow chart illustrating an exemplary process for detecting a potential failure condition of the electrical connection 1 (i.e. a condition in which the electrical connection has deteriorated and could cause a hot socket condition), determining a correction time based on the detected potential failure condition, determining whether the electricity meter 11 is in an imminent failure condition based on the correction time or the potential failure condition of the electrical connection 1, and disconnecting the power supply 13 from the electrical load 15 when the electricity meter 11 is in the imminent failure condition. As illustrated in FIG. 2, during a disconnect switch state detection step 101, it is determined whether the disconnect switch 29 is opened or closed. If the disconnect switch 29 is in a closed state the exemplary process proceeds to a temperature and current detection step 103. During the temperature and current detection step 103, the controller 25 receives a most recent temperature ($T_n$) in the vicinity of the electrical connection 1 from the temperature sensor 31, and a most recent current ($I_n$) through the electrical connection 1 from the current sensor 33. The controller 25 uses the most recent temperature ($T_n$) and current ($I_n$) to determine a correction time (Ti) in a correction time determination step 105. To determine the correction time (Ti), the controller 25 may access a lookup table, similar to the example illustrated in FIG. 4, that relates the most recent temperature ($T_n$) and current ($I_n$) to the correction time (Ti), to determine the correction time (Ti). The correction time corresponds an estimated time before the electrical connection 1 is likely to fail under the present operating conditions (i.e. if the temperature and current remain at their detected levels).

Once the correction time (Ti) is determined, the controller 25 will determine if the electrical connection 1 is in a normal state by comparing the correction time (Ti) to a time threshold in a correction time analysis step 107. If the correction time (Ti) is above the time threshold, the controller 25 determines the electrical connection 1 is in the normal state (i.e. not abnormal), and the exemplary process proceeds to an imminent failure condition determination step 111.

When the correction time (Ti) is below the time threshold, the controller 25 controls the communications board 24 to transmit the most recent temperature ($T_n$), current ($I_n$), and correction time (Ti) to the back end 27. This occurs in a correction time reporting step 109, and indicates the condition of the electrical connection 1 is abnormal. This alerts a utility that the electricity meter 11 needs to be repaired and provides the amount of time in which the repair can be made before a predicted failure of the electrical connection 1 is likely to occur. Upon transmitting the temperature ($T_n$), current ($I_n$), and correction time (Ti), or determining that the correction time (Ti) is not below the time threshold, the controller 25 proceeds to the imminent failure condition determination step 111.

The imminent failure condition is a condition in which the immediate continued operation of the electricity meter 11 will cause a failure of the electrical connection 1 to occur that is immediate. In the imminent failure condition step 111, it is determined if the electricity meter 11 is in the imminent failure condition based on the correction time and/or the information used to detect the at least one potential failure condition of the electrical connection 1. In addition, the determination that electricity meter 11 is in the imminent failure condition can be based on a comparison between the information used to detect the at least one potential failure condition of the electrical connection 1, and a temperature or current sensed by one of a plurality of other sensors that monitor other components within the electricity meter 11. Further, the determination that the electricity meter 11 is in the imminent failure condition can be based on a comparison between the information used to detect the at least one potential failure condition of the electrical connection 1, and corresponding information of another meter or plurality of meters located near the electricity meter 11.

If the electricity meter 11 is in the imminent failure condition, the controller 25 transmits information related to the imminent failure condition to the back end 27 in a imminent failure condition reporting step 112. Then the controller 25 operates the disconnect switch 29 to be opened in a disconnect switch disconnection step 113. This shuts off power to the electrical load 15. Then the controller 25 executing the exemplary process of FIG. 2 returns to the disconnect switch state detection step 101. On the other hand, if it is determined the electricity meter 11 is not in the imminent failure condition, the controller 25 then returns to the disconnect switch state detection step 101. This provides for the continuous determination of the correction time by repeating the correction time determination step 107 in future iterations of the exemplary process.

As illustrated in FIG. 2, if a disconnect switch 29 is not closed when the disconnect switch state detection step 101 is performed, the most recent temperature ($T_n$) in the vicinity of the electrical connection 1 is read in a connection temperature determination step 117. Once the most recent temperature ($T_n$) is read in the connection temperature determination step 117, it is compared to a threshold safe operating temperature in a temperature comparison step 119. If the most recent temperature ($T_n$) is less than the threshold safe operating temperature, the controller 25 checks if a disconnect switch command has been set to open in the disconnect switch command state detection step 121. If the disconnect switch command is set to closed, the disconnect switch 29 is closed in a reconnection step 123, and the process proceeds to the disconnect switch state detection step 101. If the disconnect switch command is set to open, the disconnect switch 29 is not closed and the controller 25 returns to the disconnect switch state detection step 101.

Figure 3:
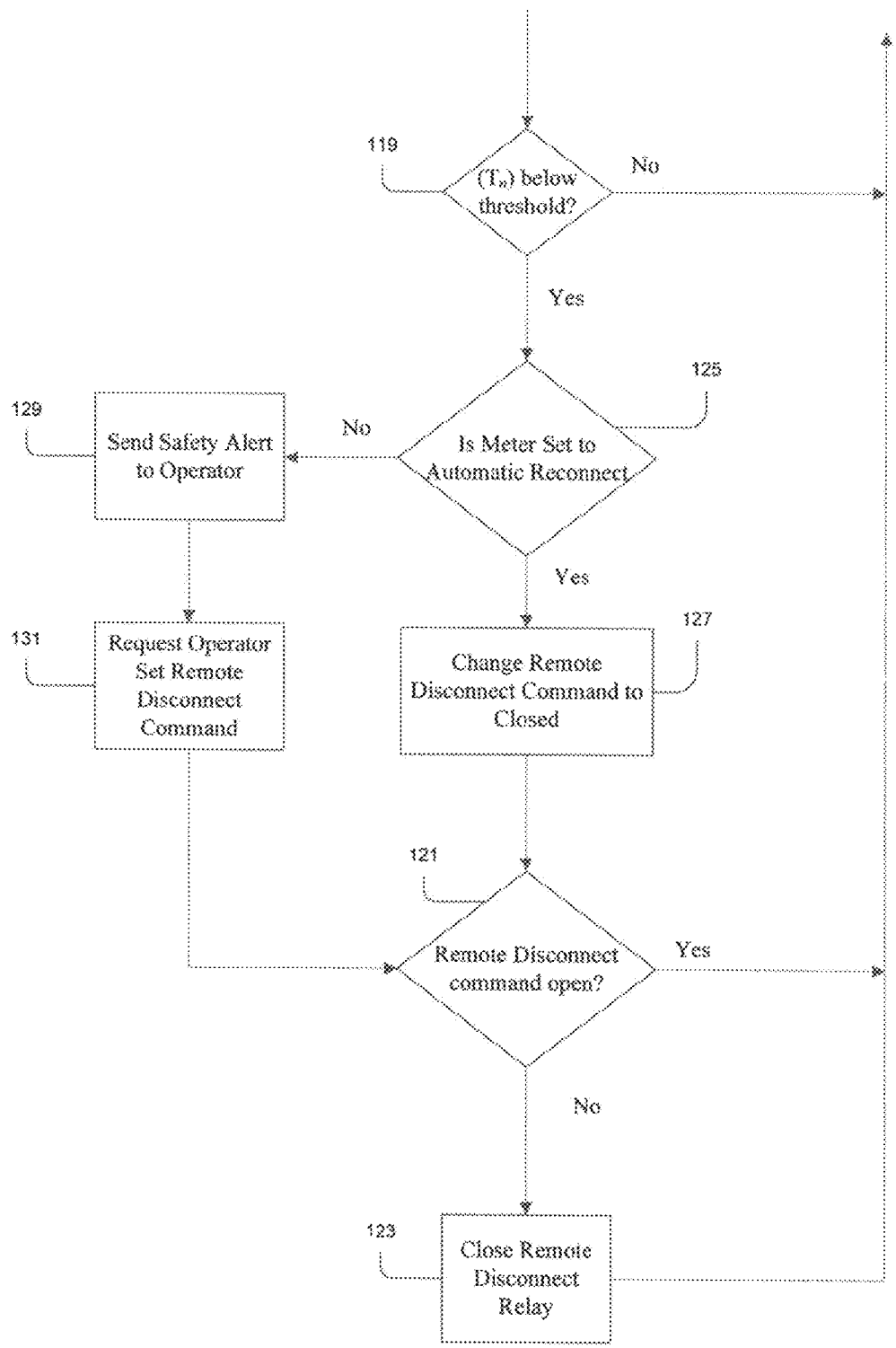
FIG. 3 is a flow chart illustrating an exemplary process for closing a disconnect switch after being opened to disconnect power to a load.

FIG. 3 illustrates an exemplary process for closing the disconnect switch 29 once the temperature in the vicinity of the electrical connection 1 becomes less than the safe operating temperature. If it is determined the most recent temperature ($T_n$) is less than the threshold safe operating temperature in the temperature comparison step 119, the controller 25 performing the exemplary process of FIG. 3 will check an automatic reconnection setting for the electricity meter 11 in the automatic reconnect detection step 125. If the automatic reconnection setting is set to automatic, the disconnect command state is automatically changed to closed in an automatic command step 127. The disconnect switch 29 is closed upon the controller 25 performing the disconnect switch command state detection step 121, and the reconnection step 123.

If the automatic reconnection setting is not set to automatic, a safety alert is sent to an external control device that can be read by an operator in a safety alert step 129. Upon receipt of the safety alert, an operator can choose to have the electrical connection 1 between the power supply 13 and the electrical load 15 restored in an operator reconnection step 131. If the operator chooses to restore the electrical connection 1, the disconnect command state is changed to closed. Then electrical connection 1 is restored by the closure of the disconnect switch 29, after the controller 25 performs the disconnect switch command state detection step 121 and the reconnection step 123. If the operator does not choose to restore the electrical connection, the disconnect command state is not changed to closed, the controller 25 performs the disconnect switch command state detection step 121, and the process returns to the disconnect switch state detection step 101.

Figure 5:
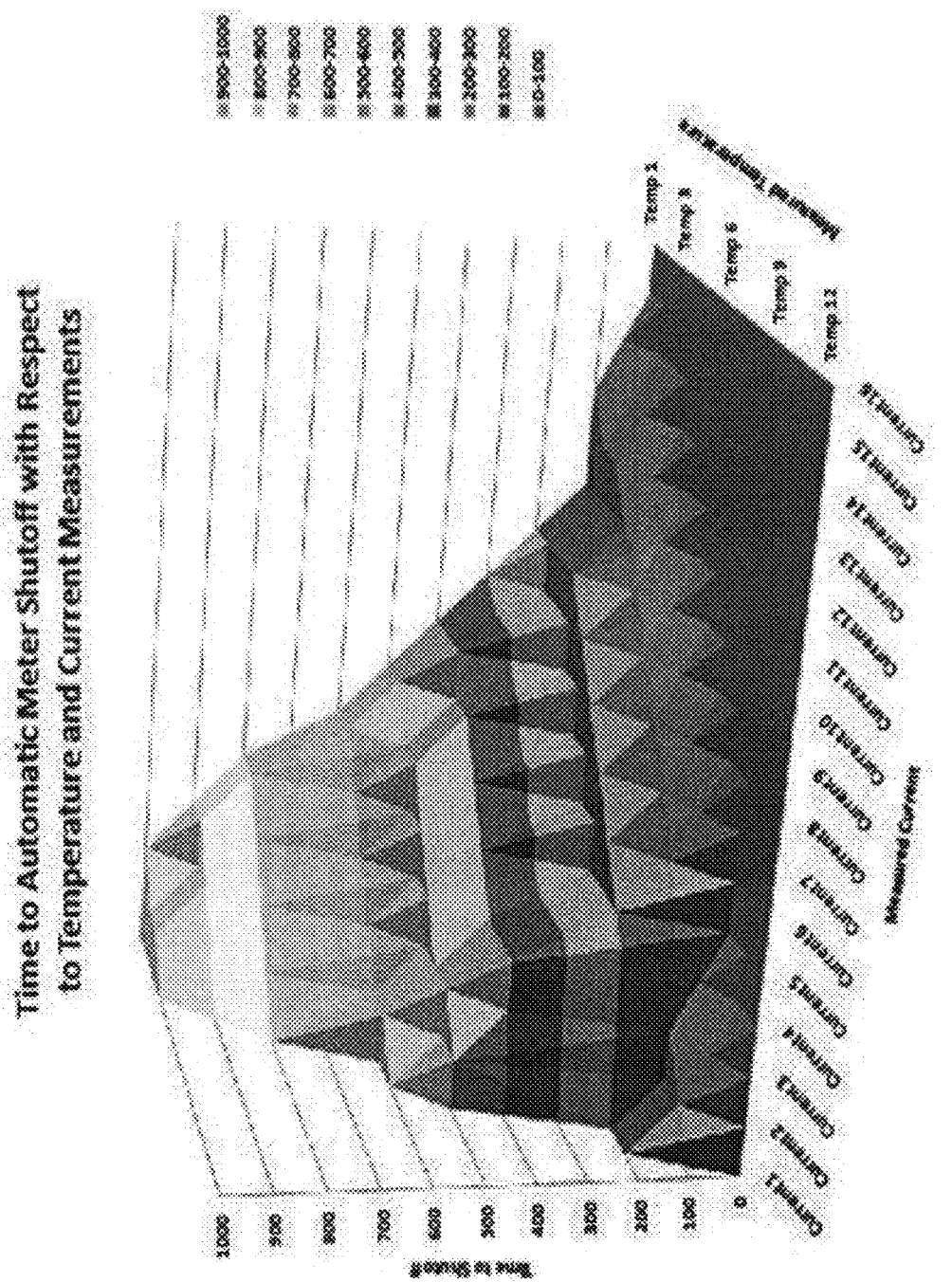
FIG. 5 is a three dimensional graph illustrating a relationship between the temperature, current, and correction time values of the lookup table of FIG. 4.

FIG. 4 provides an example of a look up table the controller 25 would reference in the correction time determination step 105. The controller 25 would determine the correction time by finding the time that corresponds to the most recent temperature ($T_n$) and current ($I_n$) which was read in the temperature and current detection step 103. FIG. 5 provides a three dimensional graph of the lookup table provided in FIG. 4. Designated temperature and current measurements will correspond to designated correction times that will cause the controller 25 to transmit warnings to the utility. The warnings include an approximate time (correction time) for the utility to respond, prior to a predicted failure of the electrical connection 1.

Figure 6:
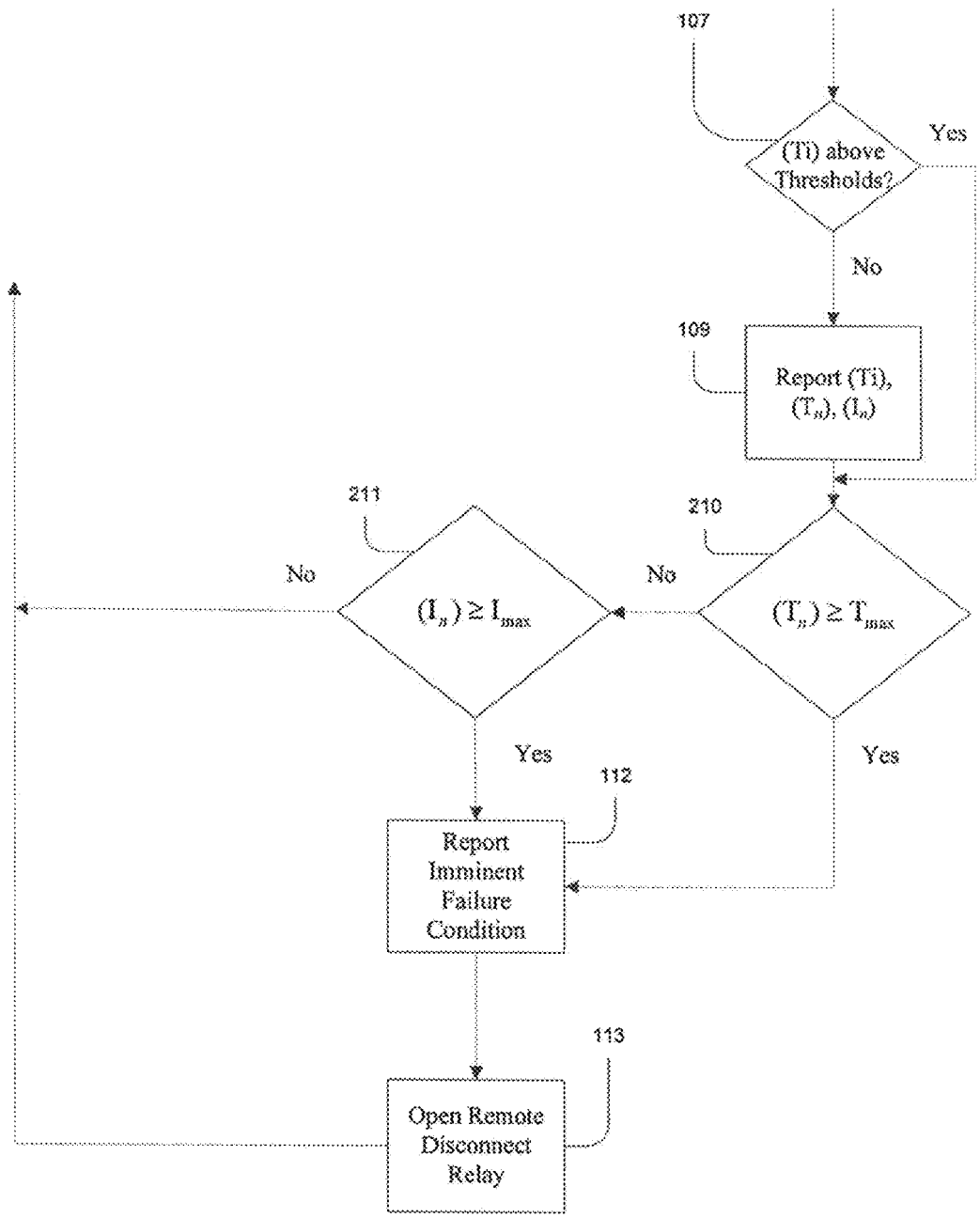
FIG. 6 is a flow chart illustrating an exemplary process for determining when a meter is in an imminent failure condition based on a maximum current and/or a maximum temperature.

FIG. 6 is a flow chart illustrating an exemplary process for determining when the electricity meter 11 is in the imminent failure condition. In the exemplary process, the controller 25 compares the most recent temperature ($T_n$) in the vicinity of the electrical connection 1 to a maximum temperature ($T_{max}$) in a temperature comparison step 211. If the temperature ($T_n$) is not greater than or equal to the maximum temperature ($T_{max}$), the controller compares the most recent current ($I_n$) through the electrical connection to a maximum current ($I_{max}$) in a current comparison step 213.

If the temperature ($T_n$) is greater than or equal to the maximum temperature ($T_{max}$), or the current ($I_n$) is greater than or equal to the maximum current ($I_{max}$), the electricity meter 11 is determined to be in the imminent failure condition, in the respective temperature 211 and current 213 comparison steps. The values for the maximum temperature ($T_{max}$) and the maximum current ($I_{max}$) can be preset and programmed into the controller 25, or, just as other threshold values discussed herein, updated through a communication from the network including the back end 27. It should also be noted that in alternative exemplary processes, only the temperature comparison step 211 or the current comparison step 213 may be incorporated.

Figure 7:
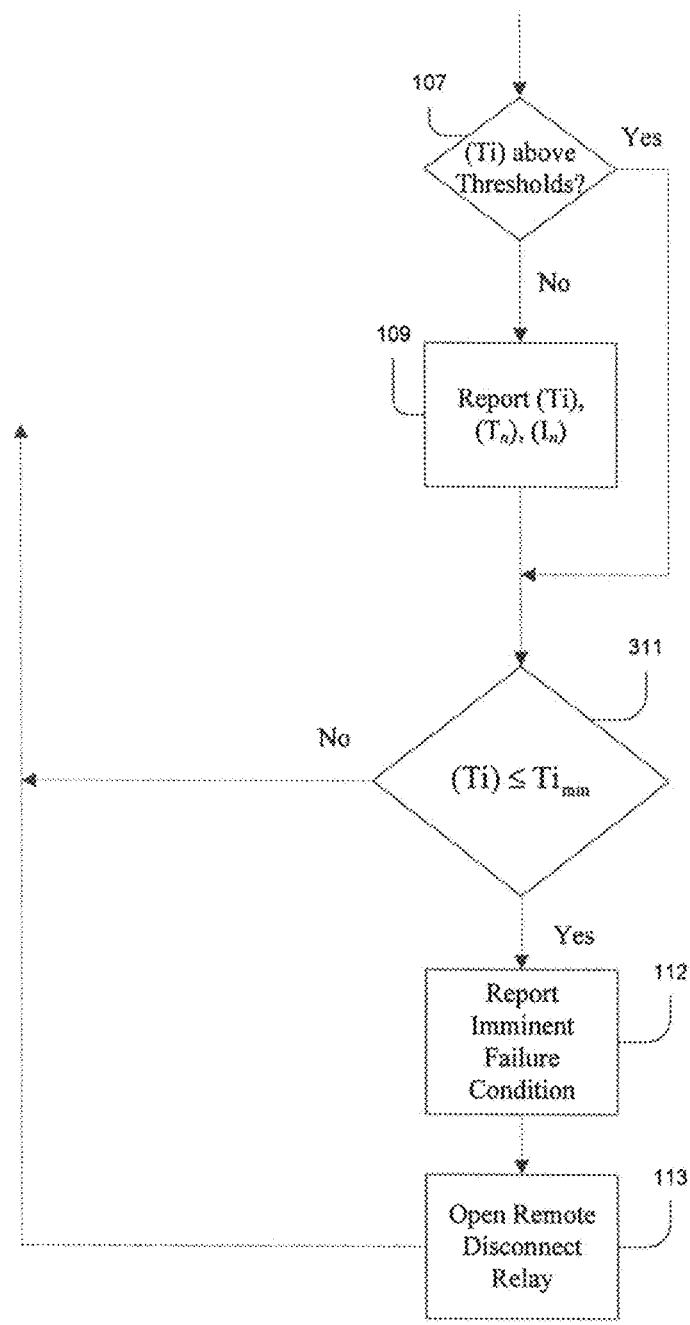
FIG. 7 is a flow chart illustrating an exemplary process for determining when a meter is in an imminent failure condition based on a correction time.

FIG. 7 is a flow chart illustrating an exemplary process for determining when the electricity meter 11 is in the imminent failure condition. In the exemplary process, the controller 25 compares the correction time (Ti), determined in the correction time determination step 105, to a minimum correction time ($Ti_{min}$) in a correction time comparison step 311. If the correction time is less than or equal to the minimum correction time ($Ti_{min}$), the electricity meter 11 is determined to be in the imminent failure condition. The controller 25 transmits information related to the imminent failure condition in the imminent failure condition reporting step 112. Then the controller 25 operates the disconnect switch 29 to be opened in a disconnect switch disconnection step 113, shutting off power to the electrical load 15.

Figure 8:
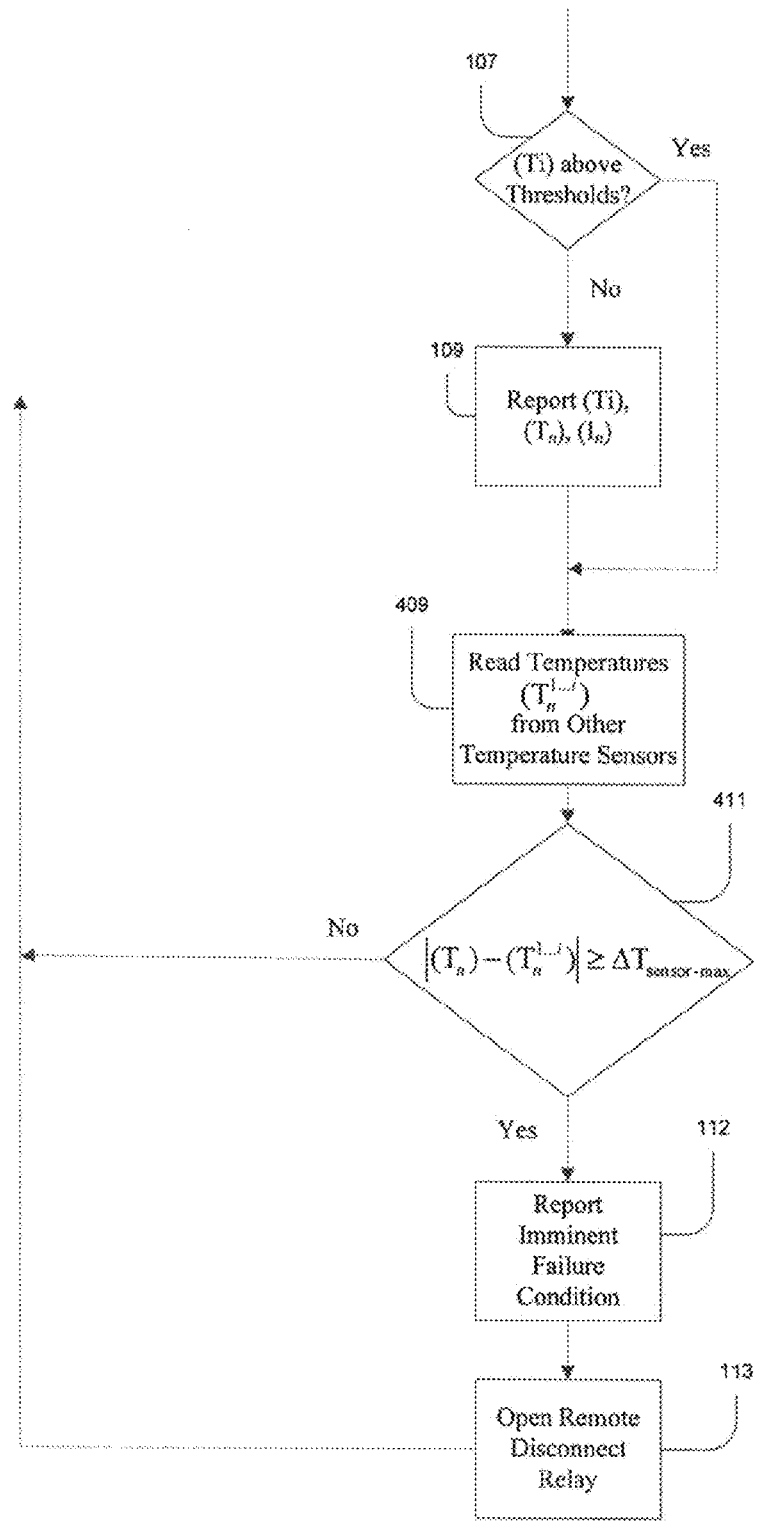
FIG. 8 is a flow chart illustrating an exemplary process for determining when a meter is in an imminent failure condition based on a temperature differential between a temperature in the vicinity of the electrical connection and another detected temperature.

FIG. 8 is a flow chart illustrating an exemplary process for determining when the electricity meter 11 is in the imminent failure condition based on a temperature differential between the most recent temperature ($T_n$) in the vicinity of the electrical connection 1, and a at least one additional temperature ($T_n^{1 \cdots i}$) detected by at least one additional temperature sensor 37 in the electricity meter 11. The electricity meter 11 can be provided with a plurality of sensors including temperature sensors that measure the temperature of the communications board 24, the temperature of the controller 25, another temperature sensor near the contacts 17, the ambient temperature of the geographic location of the electricity meter 11, etc. In the exemplary process the controller 25 reads the additional temperature ($T_n^{1 \cdots i}$) from the at least one additional temperature sensor 37 in a additional temperature read step 409. Then the controller 25 compares a difference between the most recent temperature ($T_n$) in the vicinity of the electrical connection 1 and the additional temperature ($T_n^{1 \cdots i}$), in a temperature differential determination step 411.

If the difference is greater than or equal to a maximum temperature differential) ($\Delta T_{sensor-max}$), the electricity meter 11 is determined to be in the imminent failure condition in the temperature differential determination step 411. The controller 25 transmits information related to the imminent failure condition in the imminent failure condition reporting step 112. Then the controller 25 operates the disconnect switch 29 to be opened in the disconnect switch disconnection step 113, shutting off power to the electrical load 15. On the other hand, if the difference is not greater than or equal to the maximum temperature differential ($\Delta T_{sensor-max}$), the controller 25 returns to the disconnect switch state detection step 101.

It will be understood by those skilled in the art that other components of the electricity meter 11 may not function correctly and cause temperature fluctuations within the electricity meter 11. These temperature fluctuations could affect a general state of the electricity meter 11 and cause the imminent failure condition to occur. Thus a temperature differential between any two sensors within the electricity meter 11, which do not detect the temperature in the vicinity of the electrical connection 1, could be compared to the maximum temperature differential ($\Delta T_{sensor-max}$). This could also be the basis for the controller 25 determining the electricity meter 11 is in the imminent failure condition and power should be disconnected from the electrical load 15 by operating the disconnect switch 29.

Figure 9:
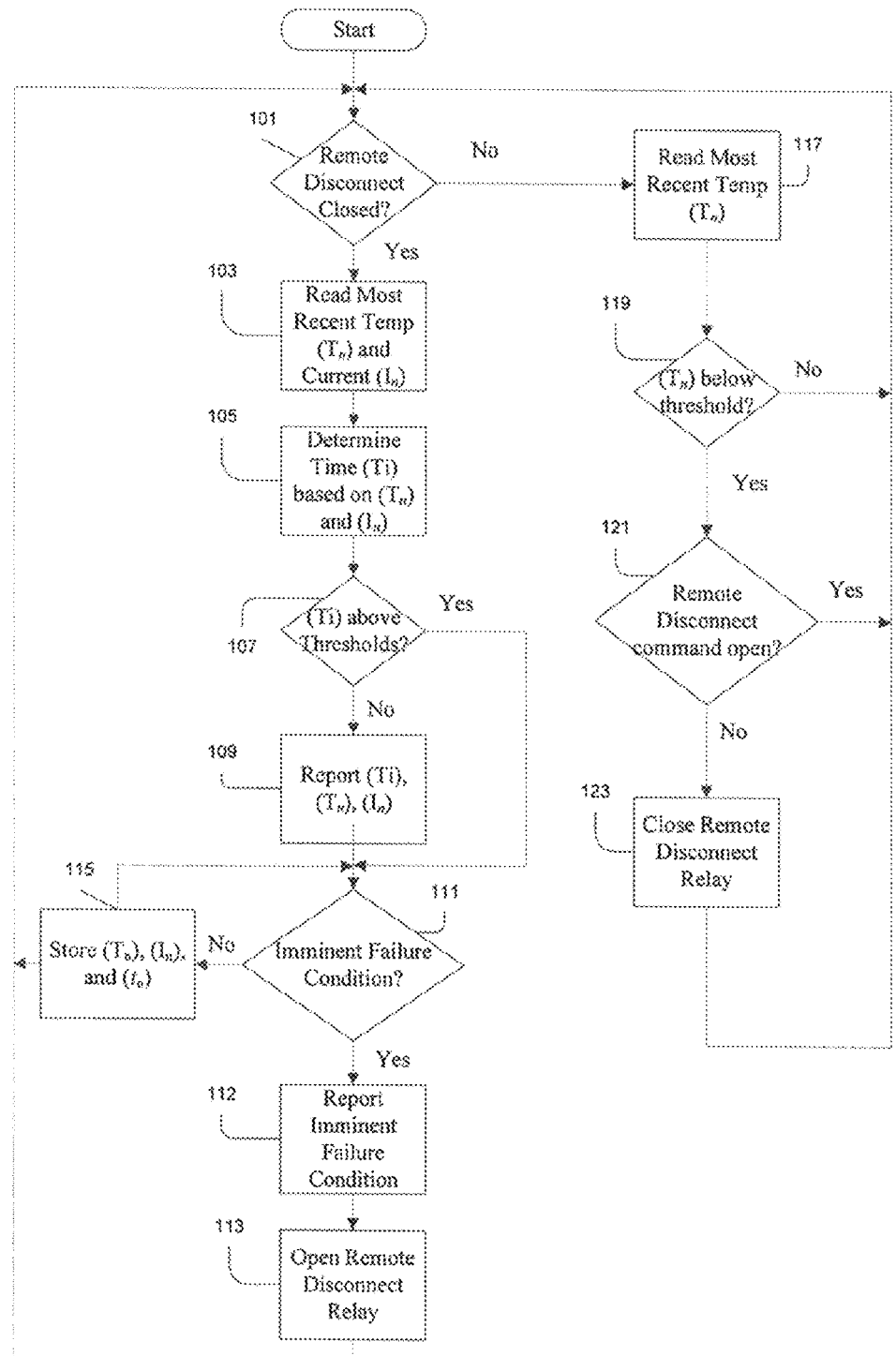
FIG. 9 is a flow chart illustrating an exemplary process for detecting a potential failure condition of an electrical connection and determining whether a meter is in an imminent failure condition that includes storing detected values for current and temperature.

FIG. 9 is a flow chart illustrating an exemplary process including a step for storing the most recent temperature ($T_n$) and current ($I_n$), and a detection time ($t_n$) when the most recent temperature ($T_n$) and current ($I_n$) were detected. As illustrated in FIG. 9, when it is determined the electricity meter 11 is not in the imminent failure condition, the controller 25 stores the most recent temperature ($T_n$), current ($I_n$), and detection time ($t_n$) in a data storage step 115. The data storage step 115 stores the most recent temperature ($T_n$), current ($I_n$), and detection time ($t_n$) in a database including previously stored values for temperature ($T_n$), current ($I_n$), and detection time ($t_n$). The stored values can be referenced in the imminent failure determination step 111 and compared to the most recent temperature ($T_n$), current ($I_n$), and detection time ($t_n$) of the next iteration of the process. Once stored, the controller 25 then returns to the disconnect switch state detection step 101.

Figure 10:
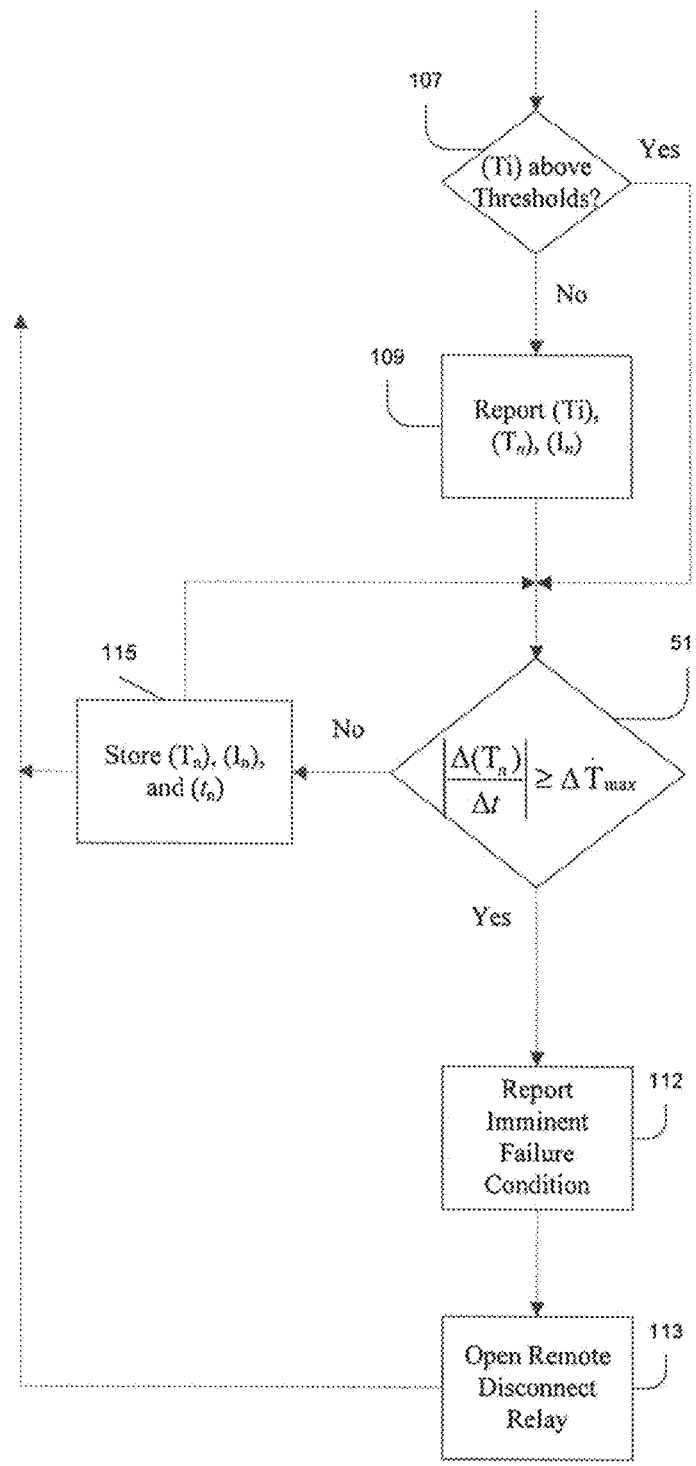
FIG. 10 is a flow chart illustrating an exemplary process for determining when a meter is in an imminent failure condition based on a rate of change in temperature.

FIG. 10 illustrates an exemplary process for determining when the electricity meter 11 is in the imminent failure condition using the data storage step 115, and based on a rate of change in temperature in the vicinity of the electrical connection 1, and. In the exemplary process of FIG. 11, the imminent failure condition determination step 111 is performed by the controller 25 executing a rate of change in temperature comparison step 511. To determine a rate of change in temperature $$\left(\frac{\Delta T}{\Delta t}\right),$$

the stored values for temperature ($T_n$) in the vicinity of the electrical connection 1 are compared to the most recent temperature ($T_n$) in the vicinity of the electrical connection 1 over a time period ($\Delta t$). The time period ($\Delta t$) is a function of the detection times ($t_n$) when the previously stored values for temperature ($T_n$) were detected in respective iterations of the process illustrated in FIG. 10. The time period ($\Delta t$) not being less than the time between consecutive iterations of the exemplary process.

If the rate of change in temperature $$\left(\frac{\Delta T}{\Delta t}\right)$$

is equal to or greater than a maximum rate of change in temperature ($\Delta \dot T_{max}$), the electricity meter 11 is determined to be in the imminent failure condition in the rate of change in temperature comparison step 511. The controller 25 transmits information related to the imminent failure condition in the imminent failure condition reporting step 112. Then the controller 25 operates the disconnect switch 29 to be opened in a disconnect switch disconnection step 113, shutting off power to the electrical load 15. On the other hand, if the rate of change in temperature $$\left(\frac{\Delta T}{\Delta t}\right)$$

is not equal to or greater than the maximum rate of temperature change ($\Delta \dot T_{max}$), the electrical connection 1 is not determined to be in the imminent failure condition, and the controller 25 stores the most recent temperature ($T_n$), current ($I_n$), and detection time ($t_n$) in the data storage step 115. The controller 25 then returns to the disconnect switch state detection step 101.

Figure 11:
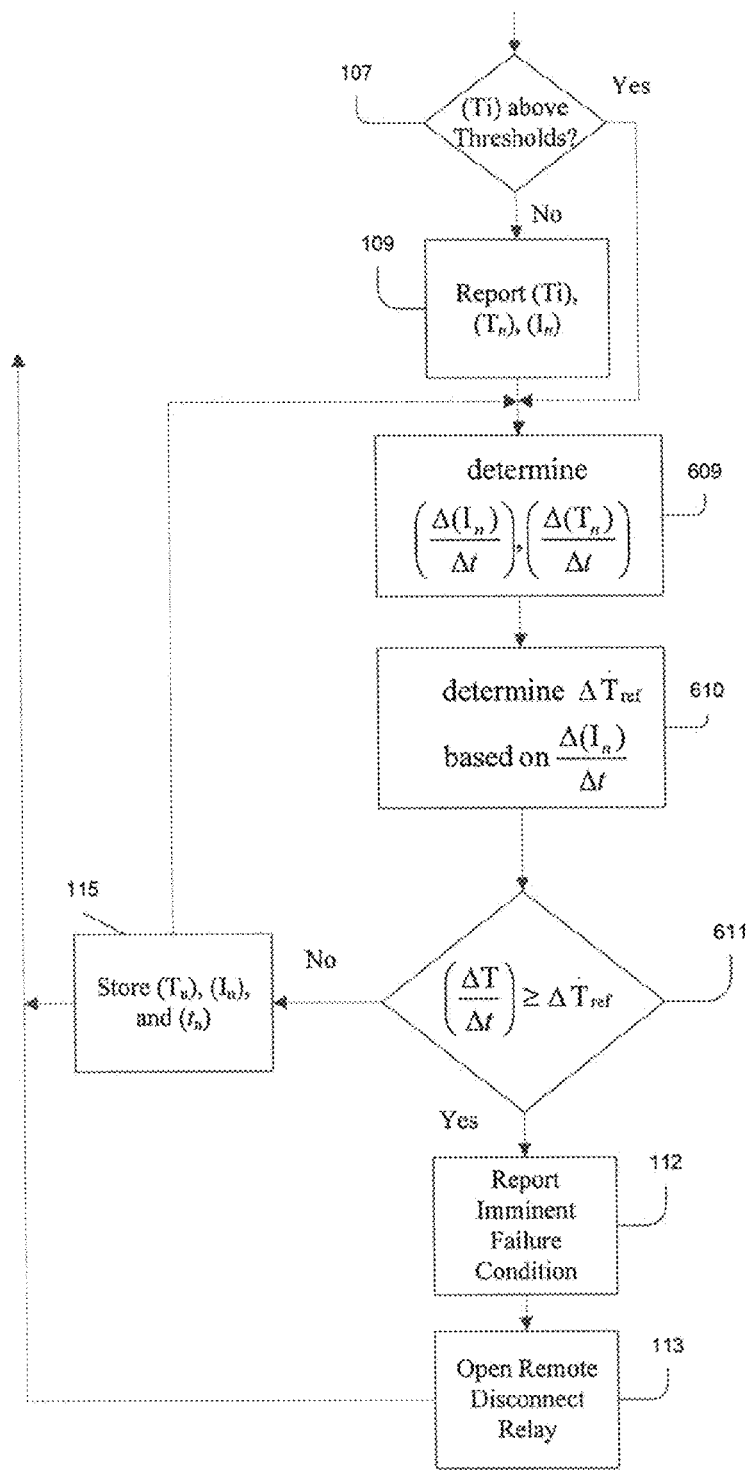
FIG. 11 is a flow chart illustrating an exemplary process for determining when a meter is in an imminent failure condition based on a reference rate of change in temperature which is determined based on a rate of change of current.

FIG. 11 illustrates an exemplary process for determining when the electricity meter 11 is in the imminent failure condition based on a rate of change in temperature in the vicinity of the electrical connection 1 as determined from a rate of change in current. In the exemplary process of FIG. 11, the imminent failure condition determination step 111 is provided by the controller executing a rate of change in current determination step 609, a reference temperature rate of change determination step 610, and a reference temperature rate of change comparison step 611. In the rate of change of current and temperature determination step 609, stored values for current ($I_n$) and temperature ($T_n$) are compared to the most recent current ($I_n$) and temperature ($T_n$) over a time period ($\Delta t$), to determine the rate of change in current $$\left(\frac{\Delta I}{\Delta t}\right)$$

and temperature $$\left(\frac{\Delta T}{\Delta t}\right).$$

The time period ($\Delta t$) is a function of the detection times ($t_n$) when the previously stored values for temperature ($T_n$) were detected in respective iterations of the process illustrated in FIG. 11. The time period ($\Delta t$) not being less than the time between consecutive iterations of the exemplary process.

In the reference temperature rate of change determination step 610, the rate of change in current $$\left(\frac{\Delta I}{\Delta t}\right)$$

is used to determine a corresponding reference rate of change in temperature $\Delta \dot T_{ref}$. This may be accomplished using a formula or by referencing a rate of change look up table. The rate of change look up table would include expected values for a rate of change in temperature for given values for a rate of change in current. The expected values corresponding to values for the rate of change in temperature under which the electricity meter 11 would not be in an imminent failure condition.

In the reference temperature rate of change comparison step 611, the rate of change in temperature $$\left(\frac{\Delta T}{\Delta t}\right)$$

is compared to the reference rate of change in temperature $\Delta \dot T_{ref}$. If the rate of change in temperature $$\left(\frac{\Delta T}{\Delta t}\right)$$

is equal to or greater than reference rate of change in temperature $\Delta \dot T_{ref}$ the electricity meter 11 is determined to be in the imminent failure condition. The controller 25 transmits information related to the imminent failure condition in the imminent failure condition reporting step 112. Then the controller 25 operates the disconnect switch 29 to be opened in the disconnect switch disconnection step 113, shutting off power to the electrical load 15. On the other hand, if the rate of change in temperature $$\left(\frac{\Delta T}{\Delta t}\right)$$

is not greater than or equal to the reference rate of change in temperature $\Delta \dot{T}_{ref}$, the electrical connection 1 is not determined to be in the critical state. The controller 25 stores the most recent temperature ($T_n$), current ($I_n$), and detection time ($t_n$) in the data storage step 115, and returns to the disconnect switch state detection step 101.

Thus, the foregoing discussion discloses and describes merely exemplary embodiments of the present invention. As will be understood by those skilled in the art, the present invention may be embodied in other specific forms without departing from the spirit or essential characteristics thereof. For example, the exemplary process illustrated in FIG. 2 may incorporate any of the processes for determining the condition of an electricity meter illustrated in FIGS. 6-8 and described herein. More than one of these processes could be incorporated into the exemplary process of FIG. 2. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A method of monitoring and controlling an operation of a meter electrically connected between a power source and a load through a meter socket, comprising:
   detecting at least one potential failure condition of an electrical connection between the meter and the meter socket;
   determining, based on the detected at least one potential failure condition, a correction time indicating an amount of time before a predicted failure of the electrical connection;
   determining whether the meter is in an imminent failure condition based on the correction time by comparing the correction time to a minimum correction time;
   determining whether the meter is in the imminent failure condition based on the detected at least one potential failure condition; and
   disconnecting power to the load with the meter when it is determined the meter is in the imminent failure condition.

2. The method according to claim 1, wherein disconnecting power includes transmitting a notification of the meter being in the imminent failure condition to a location.

3. The method according to claim 1, wherein detecting the at least one potential failure condition comprises detecting a current through the electrical connection and a temperature in the vicinity of the electrical connection.

4. The method according to claim 3, wherein determining the correction time comprises relating the temperature in the vicinity of the electrical connection and the current through the electrical connection to a time value in a lookup table that relates temperature and current to time.

5. The method according to claim 3, wherein determining whether the meter is in the imminent failure condition based on the detected at least one potential failure condition comprises:
   determining a rate of change in temperature based on the temperature in the vicinity of the electrical connection and at least one previously detected temperature in the vicinity of the electrical connection;
   determining a rate of change in current based on the current through the electrical connection and at least one previously detected current through the electrical connection;
   determining a reference rate of change in temperature based on the rate of change in current;
   comparing the rate of change in temperature to the reference rate of change in temperature; and
   determining the meter is in the imminent failure condition when rate of change in temperature is equal to or greater than the reference rate of temperature.

6. The method according to claim 3, wherein determining whether the meter is in the imminent failure condition based on the detected at least one potential failure condition comprises:
   determining a rate of change in temperature based on the temperature in the vicinity of the electrical connection and at least one previously detected temperature in the vicinity of the electrical connection;
   comparing the rate of change in temperature to a threshold rate of change in temperature; and
   determining the meter is in the imminent failure condition when the rate of change in temperature is equal to or greater than the threshold rate of change in temperature.

7. The method according to claim 3, wherein determining whether the meter is in the imminent failure condition based on the detected at least one potential failure condition comprises:
   detecting at least one additional temperature with at least one of a plurality of additional temperature sensors and determining at least one temperature differential based on the at least one additional temperature and the temperature in the vicinity of the electrical connection;
   comparing the at least one temperature differential to a threshold temperature differential; and
   determining the meter is in the imminent failure condition when the at least one temperature differential is equal to or greater than the threshold temperature differential.

8. The method according to claim 3, wherein determining whether the meter is in the imminent failure condition based on the detected at least one potential failure condition comprises:
   comparing the current through the electrical connection to a maximum current; and
   determining the meter is in the imminent failure condition when the current through the electrical connection is greater than the maximum current.

9. The method according to claim 3, wherein determining whether the meter is in the imminent failure condition based on the detected at least one potential failure condition comprises:
   comparing the temperature in the vicinity of the electrical connection to a maximum temperature; and
   determining the meter is in the imminent failure condition when the temperature in the vicinity of the electrical connection is equal to or greater than the maximum temperature.

10. The method according to claim 1, further comprising:
    determining the detected at least one failure condition is abnormal based on the correction time when the correction time is less than a threshold correction time; and
    transmitting the correction time to a location when the detected at least one potential failure condition is abnormal.

11. The method according to claim 10, wherein determining whether the meter is in the imminent failure condition based on the correction time comprises:

determining the detected at least one potential failure condition is abnormal;
comparing the correction time to the minimum correction time; and
determining the meter is in the imminent failure condition when the correction time is less than the minimum correction time.

12. The method according to claim 1, wherein disconnecting power to the load with the meter when it is determined the meter is in the imminent failure condition comprises operating a disconnect switch to be set to an open state, wherein the disconnect switch is in a line within the meter that provides power to the load.

13. The method according to claim 12 further comprising:
monitoring a temperature in the vicinity of the electrical connection after the disconnect switch is set to the open state;
operating the disconnect switch to be set in a closed state and connecting power to the load with the meter when the temperature in the vicinity of the electrical connection is less than a threshold safe temperature.

14. The method according to claim 12, further comprising:
monitoring a temperature in the vicinity of the electrical connection after the disconnect switch is set to the open state;
transmitting a safe temperature alert to an external control when the temperature in the vicinity of the electrical connection is less than a threshold safe temperature; and
operating the disconnect switch to be set in a closed state and connecting power to the load with the meter when a closed command is received from the external control.

15. An apparatus that monitors and controls the operation of a meter electrically connected between a power source and a load through a meter socket, comprising:
a detection unit configured to monitor an electrical connection between the meter and the meter socket, and detect at least one potential failure condition of the electrical connection; and
a controller configured to:
determine a correction time, based on the detected at least one potential failure condition of the electrical connection, that indicates an amount of time before a predicted failure of the electrical connection,
determine whether the meter is in an imminent failure condition based on the correction time by comparing the correction time to a minimum correction time,
determine whether the meter is in the imminent failure condition based on the detected at least one potential failure condition, and
disconnect power to the load with the meter when it is determined the meter is in the imminent failure condition.

16. The apparatus according to claim 15, the controller is configured to transmits a notification of the imminent failure condition to a location.

17. The apparatus according to claim 15, wherein the detection unit comprises:
at least one temperature sensor that detects a temperature in the vicinity of the electrical connection; and
at least one current sensor that detects a current through the electrical connection, wherein
the detection unit is configured to detect the detected at least one potential failure condition by reading the temperature in the vicinity of electrical connection and the current through the electrical connection.

18. The apparatus according to claim 17, wherein the controller is configured to determine the correction time by relating the temperature in the vicinity of the electrical connection and the current through the electrical connection to a time value in a lookup table that relates temperature and current to time.

19. The apparatus according to claim 17, wherein
the controller is configured to determine the meter is in the imminent failure condition based on the detected at least one potential failure condition by determining a rate of change in temperature is greater than a reference rate of change in temperature; and
the controller is configured to determine the reference rate of change of temperature based on a rate of change of current through the electrical connection, wherein
the rate of change in temperature is based on the temperature in the vicinity of the electrical connection and at least one previously detected temperature in the vicinity of the electrical, and the rate of change in current is based on the current through the electrical connection and at least one previously detected current through the electrical connection.

20. The apparatus according to claim 17, wherein
the controller is configured to determine the meter is in the imminent failure condition based on the detected at least one potential failure condition by determining when one of the temperature in the vicinity of the electrical connection is higher than a maximum temperature and the current through the electrical connection is higher than a maximum current.

21. The apparatus according to claim 17, further comprising:
at least one additional temperature sensor that detects at least one additional temperature, wherein
the controller is further configured to determine the meter is in the imminent failure condition when a difference between the temperature in the vicinity of the electrical connection and the at least one additional temperature is greater than at least one temperature differential threshold.

22. The apparatus according to claim 15, further comprising:
a disconnect switch provided within the meter and set by the controller, wherein
the disconnect switch connects power to the load when set to a closed state and disconnects power to the load when set to an open state, wherein
the detection unit is configured to detect a temperature in the vicinity of the electrical connection, and
the controller is configured to set the disconnect switch to the open state when the controller determines the meter is in the imminent failure condition, and the controller is configured to set the disconnect switch to the closed state when the controller determines the temperature in the vicinity of the electrical connection is less than a threshold safe operating temperature.

23. A method of monitoring and controlling an operation of a meter electrically connected between a power source and a load through a meter socket, comprising:
detecting at least one potential failure condition of an electrical connection between the meter and the meter socket;
determining, based on the detected at least one potential failure condition, a correction time indicating an amount of time before a predicted failure of the electrical connection;
determining whether the meter is in an imminent failure condition based on at least one of the correction time and the detected at least one potential failure condition; and disconnecting power to the load with the meter when it is determined the meter is in the imminent failure condition, wherein detecting the at least one potential failure condition comprises detecting a current through the electrical connection and a temperature in the vicinity of the electrical connection, wherein determining whether the meter is in the imminent failure condition based on the detected at least one potential failure condition includes:

determining a rate of change in temperature based on the temperature in the vicinity of the electrical connection and at least one previously detected temperature in the vicinity of the electrical connection;

determining a rate of change in current based on the current through the electrical connection and at least one previously detected current through the electrical connection;

determining a reference rate of change in temperature based on the rate of change in current;

comparing the rate of change in temperature to the reference rate of change in temperature; and determining the meter is in the imminent failure condition when rate of change in temperature is equal to or greater than the reference rate of temperature.

24. An apparatus that monitors and controls the operation of a meter electrically connected between a power source and a load through a meter socket, comprising:

a detection unit including at least one temperature sensor that detects a temperature in the vicinity of the electrical connection, and at least one current sensor that detects a current through the electrical connection; and a controller configured to:

determine a correction time, based on the detected at least one potential failure condition of the electrical connection, that indicates an amount of time before a predicted failure of the electrical connection, determine whether the meter is in an imminent failure condition based on at least one of the correction time and the at least one potential failure condition, and disconnect power to the load with the meter when it is determined the meter is in the imminent failure condition, wherein the detection unit is configured to monitor an electrical connection between the meter and the meter socket, and detect at least one potential failure condition of the electrical connection by reading the temperature in the vicinity of electrical connection and the current through the electrical connection, wherein the controller is configured to determine the meter is in the imminent failure condition based on the detected at least one potential failure condition by determining a rate of change in temperature is greater than a reference rate of change in temperature, wherein the controller is configured to determine the reference rate of change of temperature based on a rate of change of current through the electrical connection, and wherein the rate of change in temperature is based on the temperature in the vicinity of the electrical connection and at least one previously detected temperature in the vicinity of the electrical, and the rate of change in current is based on the current through the electrical connection and at least one previously detected current through the electrical connection.

\* \* \* \* \*